(12) United States Patent
Pu et al.

(10) Patent No.: US 8,214,697 B2
(45) Date of Patent: Jul. 3, 2012

(54) DEINTERLEAVER FOR A COMMUNICATION DEVICE

(75) Inventors: Tianyan Pu, Singapore (SG); Sergi V. Sawitzki, Veldhoven (NL)

(73) Assignee: NXP B.V. (NL)

( * ) Notice: Subject to any disclaimer, the term of this patent is extended or adjusted under 35 U.S.C. 154(b) by 771 days.

(21) Appl. No.: 12/440,954

(22) PCT Filed: Sep. 10, 2007

(86) PCT No.: PCT/IB2007/053643
§ 371 (c)(1),
(2), (4) Date: Mar. 12, 2009

(87) PCT Pub. No.: WO2008/032261
PCT Pub. Date: Mar. 20, 2008

(65) Prior Publication Data
US 2010/0042899 A1    Feb. 18, 2010

(30) Foreign Application Priority Data
Sep. 12, 2006  (EP) ..................... 06120514

(51) Int. Cl.
*G11C 29/00* (2006.01)
(52) U.S. Cl. ................ 714/702; 714/755; 714/762
(58) Field of Classification Search .............. 714/702, 714/755, 762
See application file for complete search history.

(56) References Cited

U.S. PATENT DOCUMENTS

| | | | |
|---|---|---|---|
| 5,627,935 A | * | 5/1997 | Kim .................. 386/263 |
| 5,946,357 A | * | 8/1999 | Sandin et al. ............ 375/296 |
| 6,363,026 B1 | * | 3/2002 | Su et al. .............. 365/230.01 |
| 6,732,316 B1 | * | 5/2004 | Tong et al. ................. 714/756 |

(Continued)

FOREIGN PATENT DOCUMENTS
WO    2004015945 A1    2/2004

OTHER PUBLICATIONS

Horvath, L., et al; "A Novel, High-Speed, Reconfigurable Demapper-Sympol Deinterleaver Architecture for DVB-T"; Proc of Intern. Symposium on Circuits and Systems 1999; Orlando, FL, USA; vol. 4; May 30, 1999; pp. 382-385; XP010341250; ISBN: 0-7803-5471-0.

(Continued)

*Primary Examiner* — Esaw Abraham
(74) *Attorney, Agent, or Firm* — Kramer & Amando P.C.

(57) ABSTRACT

A deinterleaver for a wireless communication device is provided that is simple and inexpensive to implement. In particular, a deinterleaver for deinterleaving a stream of data bits representing a plurality of symbols that have been interleaved using a multi-stage interleaving scheme is provided, the deinterleaver comprising preprocessing means for ordering the data bits in the stream into pairs, such that the data bits in the pair are consecutive data bits from a symbol; at least one memory for storing the paired bits, such that each pair of data bits is stored in a respective location in the memory; and a read and write address generator for the at least one memory, the generator being adapted to determine the addresses in the at least one memory that pairs of data bits are to be stored, and to determine the addresses in the at least one memory that pairs of data bits are to be read from.

20 Claims, 15 Drawing Sheets

U.S. PATENT DOCUMENTS

| | | | |
|---|---|---|---|
| 7,149,207 B2 * | 12/2006 | Okumura et al. | 370/350 |
| 7,342,915 B2 * | 3/2008 | Okumura et al. | 370/350 |
| 7,428,667 B2 * | 9/2008 | Kawahara et al. | 714/701 |
| 7,469,365 B2 * | 12/2008 | Kawahara et al. | 714/701 |
| 7,900,097 B2 * | 3/2011 | Wellig et al. | 714/701 |
| 8,082,483 B2 * | 12/2011 | Nguyen | 714/774 |
| 2004/0178934 A1 | 9/2004 | Balakrishnan et al. | |
| 2004/0268207 A1 | 12/2004 | Sharma | |
| 2005/0034046 A1 | 2/2005 | Berkmann et al. | |
| 2005/0152327 A1 | 7/2005 | Erlich et al. | |

OTHER PUBLICATIONS

Richter, Thomas, et al; "Parallel Interleaving on Parallel DSP Architectures"; 2002; IEEE, New York, USA; ISBN: 0-7803-7587-4; pp. 195-200.

MBOA-SIG, MultiBand OFDM Alliance SIG, "MultiBand OFDM Physical Layer Proposal for IEEE 802.15 Task Group 3a", Sep. 14, 2004, pp. 1-125.

* cited by examiner

| Data Rate (Mb/s) | $N_{CBPS}$ | $N_{Tint}$ | $N_{TDS}$ | $N_{cyc}$ | Deintv_type | M |
|---|---|---|---|---|---|---|
| 39.4 | 100 | 10 | 2 | 33 | 1 | 0-2 |
| 53.3 | 100 | 10 | 2 | 33 | 1 | 0-2 |
| 80 | 100 | 10 | 2 | 33 | 1 | 0-2 |
| 106.7 | 200 | 20 | 2 | 66 | 2 | 0-2 |
| 160 | 200 | 20 | 2 | 66 | 2 | 0-2 |
| 200 | 200 | 20 | 2 | 66 | 2 | 0-2 |
| 320 | 200 | 20 | 1 | 33 | 3 | 0-5 |
| 400 | 200 | 20 | 1 | 33 | 3 | 0-5 |
| 480 | 200 | 20 | 1 | 33 | 3 | 0-5 |

FIG. 3a

| | Address |
|---|---|
| $sym_{0,0}$ | 0 |
| $sym_{1,0}$ | 167 |
| $sym_{2,0}$ | 234 |
| $sym_{0,1}$ | 10 |
| $sym_{1,1}$ | 177 |
| $sym_{2,1}$ | 244 |
| $sym_{0,2}$ | 20 |

FIG. 3b

| | Address |
|---|---|
| $sym_{0,0}$ | 0 |
| $sym_{1,0}$ | 334 |
| $sym_{2,0}$ | 468 |
| $sym_{0,1}$ | 20 |
| $sym_{1,1}$ | 354 |
| $sym_{2,1}$ | 488 |
| $sym_{2,6}$ | 588 |
| $sym_{0,7}$ | 140 |
| $sym_{1,7}$ | 274 |
| $sym_{2,7}$ | 408 |

FIG. 3c

| | Address |
|---|---|
| $sym_{0,0}$ | 0 |
| $sym_{1,0}$ | 367 |
| $sym_{2,0}$ | 534 |
| $sym_{3,0}$ | 701 |
| $sym_{4,0}$ | 868 |
| $sym_{5,0}$ | 1035 |
| $sym_{0,1}$ | 20 |
| $sym_{1,1}$ | 387 |
| $sym_{2,1}$ | 554 |
| $sym_{3,1}$ | 721 |
| $sym_{4,1}$ | 888 |
| $sym_{5,1}$ | 1055 |
| $sym_{0,2}$ | 40 |

FIG. 4a

| Address | |
|---|---|
| 0 | $sym_{0,0}$ |
| 1 | $sym_{0,10}$ |
| 10 | $sym_{0,1}$ |
| 11 | $sym_{0,11}$ |
| 100 | $sym_{1,33}$ |
| 101 | $sym_{1,43}$ |
| 200 | $sym_{2,66}$ |
| 201 | $sym_{2,76}$ |

FIG. 4b

| Address | |
|---|---|
| 0 | $sym_{0,0}$ |
| 1 | $sym_{0,10}$ |
| 20 | $sym_{0,1}$ |
| 21 | $sym_{0,11}$ |
| 200 | $sym_{1,63}$ |
| 201 | $sym_{1,73}$ |
| 400 | $sym_{2,126}$ |
| 401 | $sym_{2,136}$ |

FIG. 4c

| Address | |
|---|---|
| 0 | $sym_{0,0}$ |
| 1 | $sym_{0,10}$ |
| 20 | $sym_{0,1}$ |
| 21 | $sym_{0,11}$ |
| 200 | $sym_{1,131}$ |
| 201 | $sym_{1,141}$ |
| 400 | $sym_{2,63}$ |
| 401 | $sym_{2,73}$ |
| 600 | $sym_{3,194}$ |
| 601 | $sym_{3,5}$ |

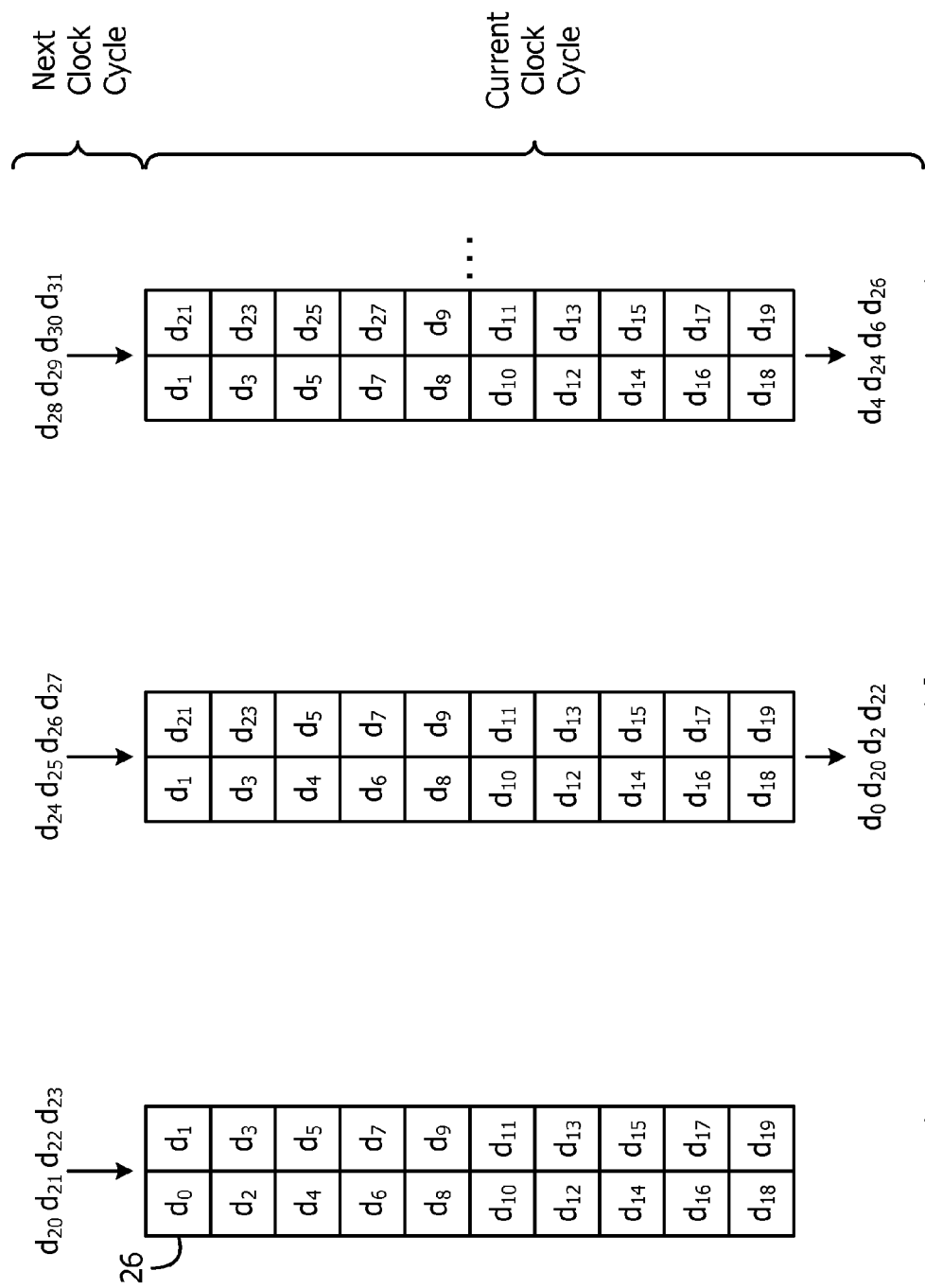

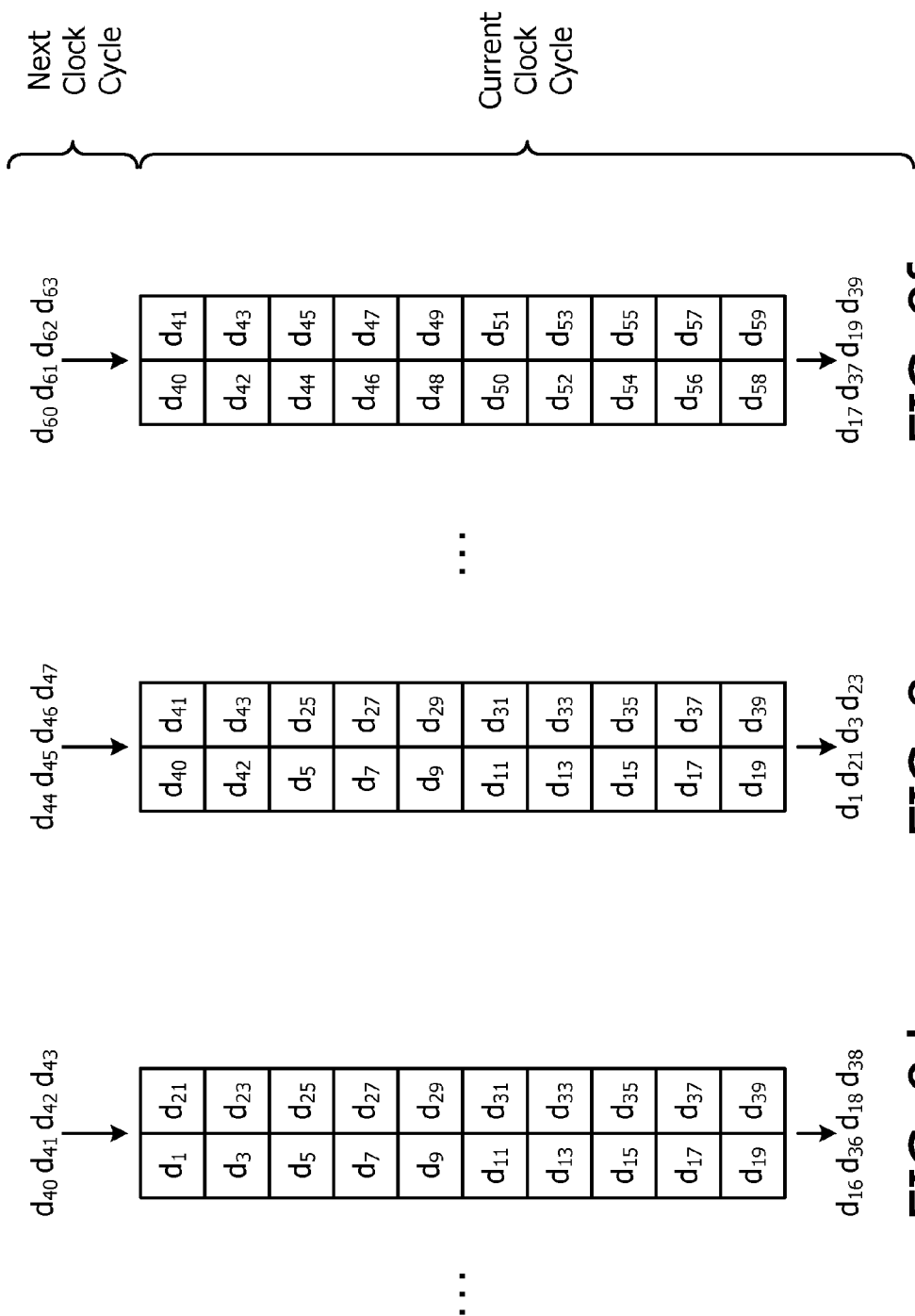

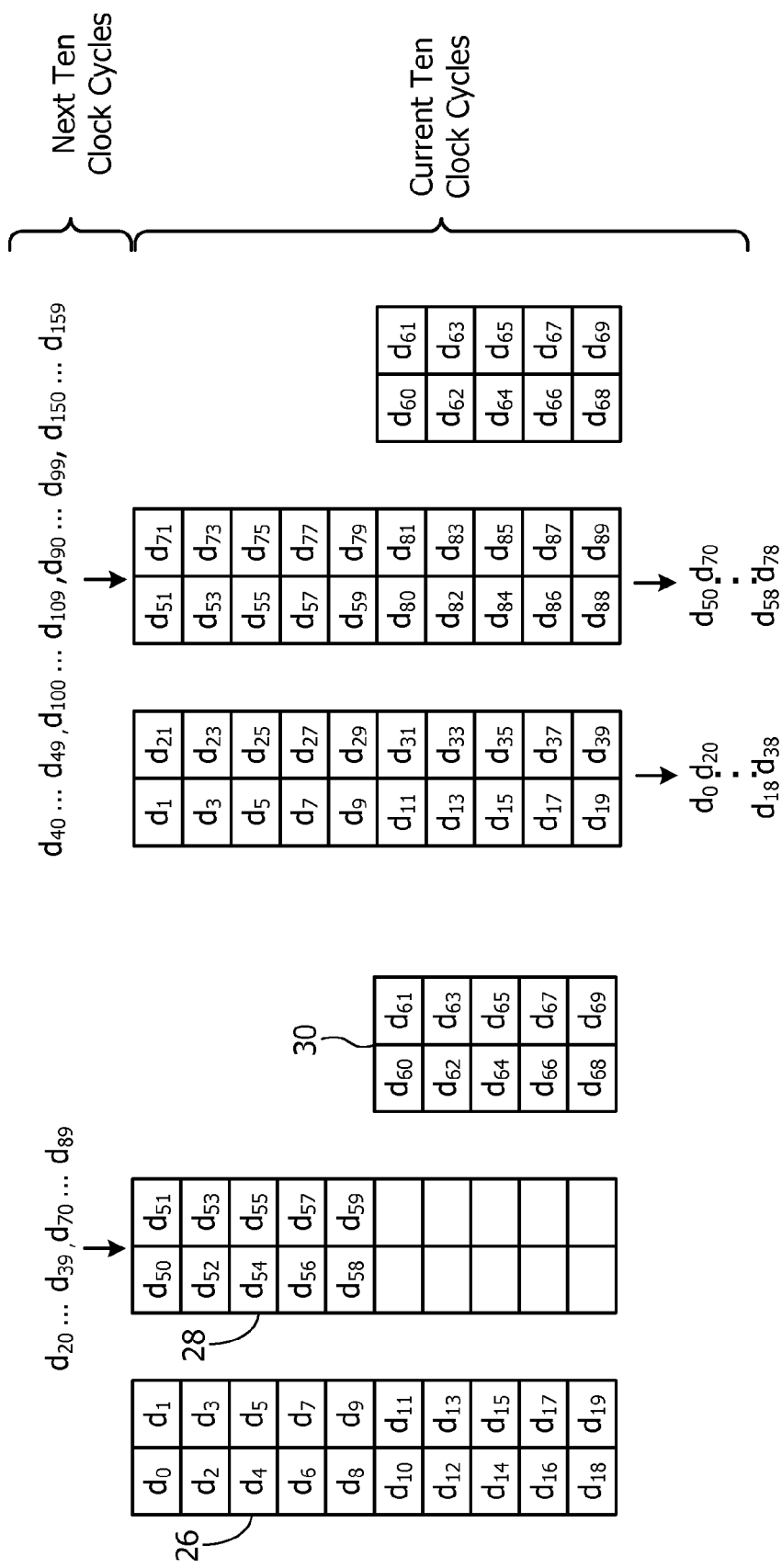

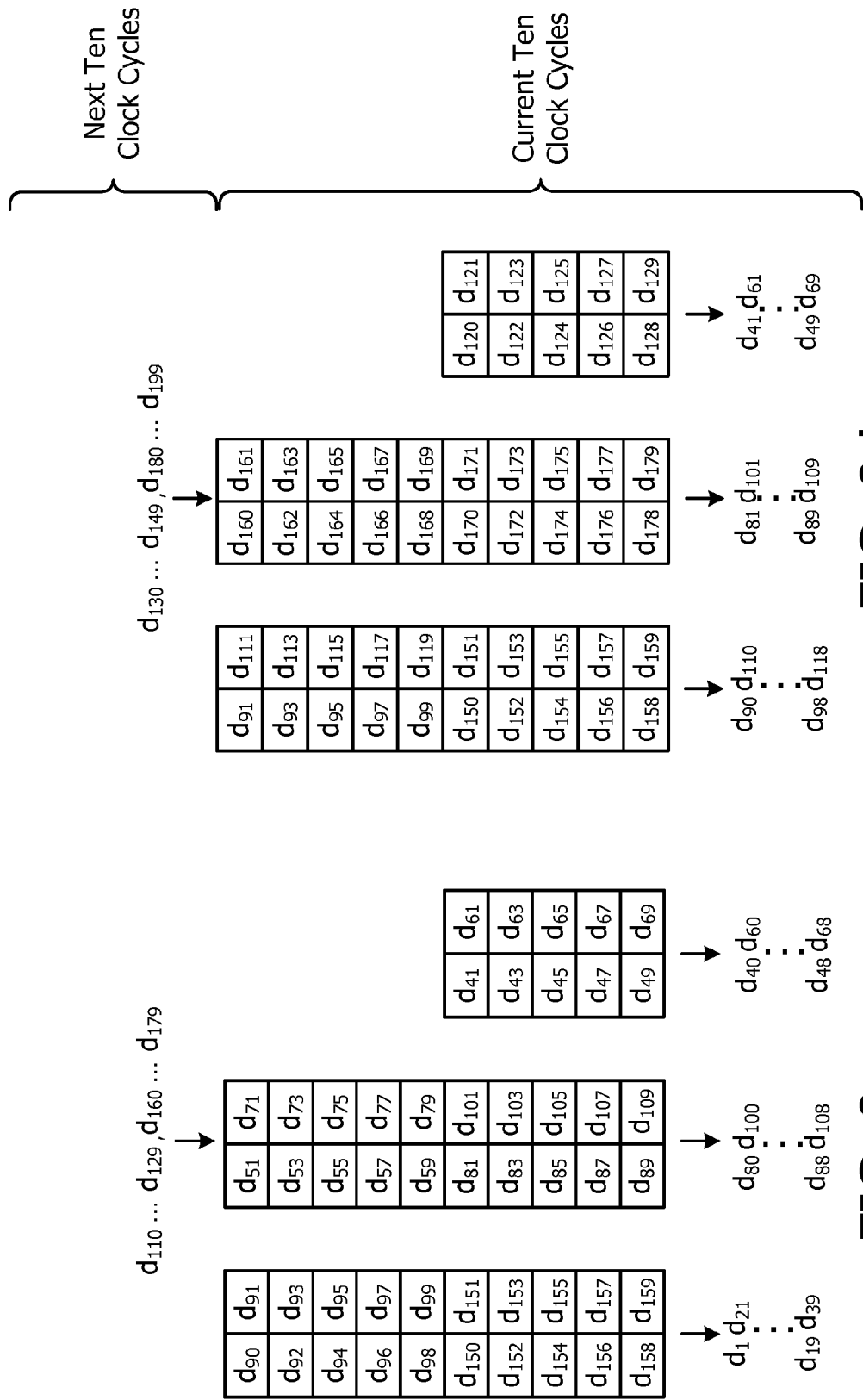

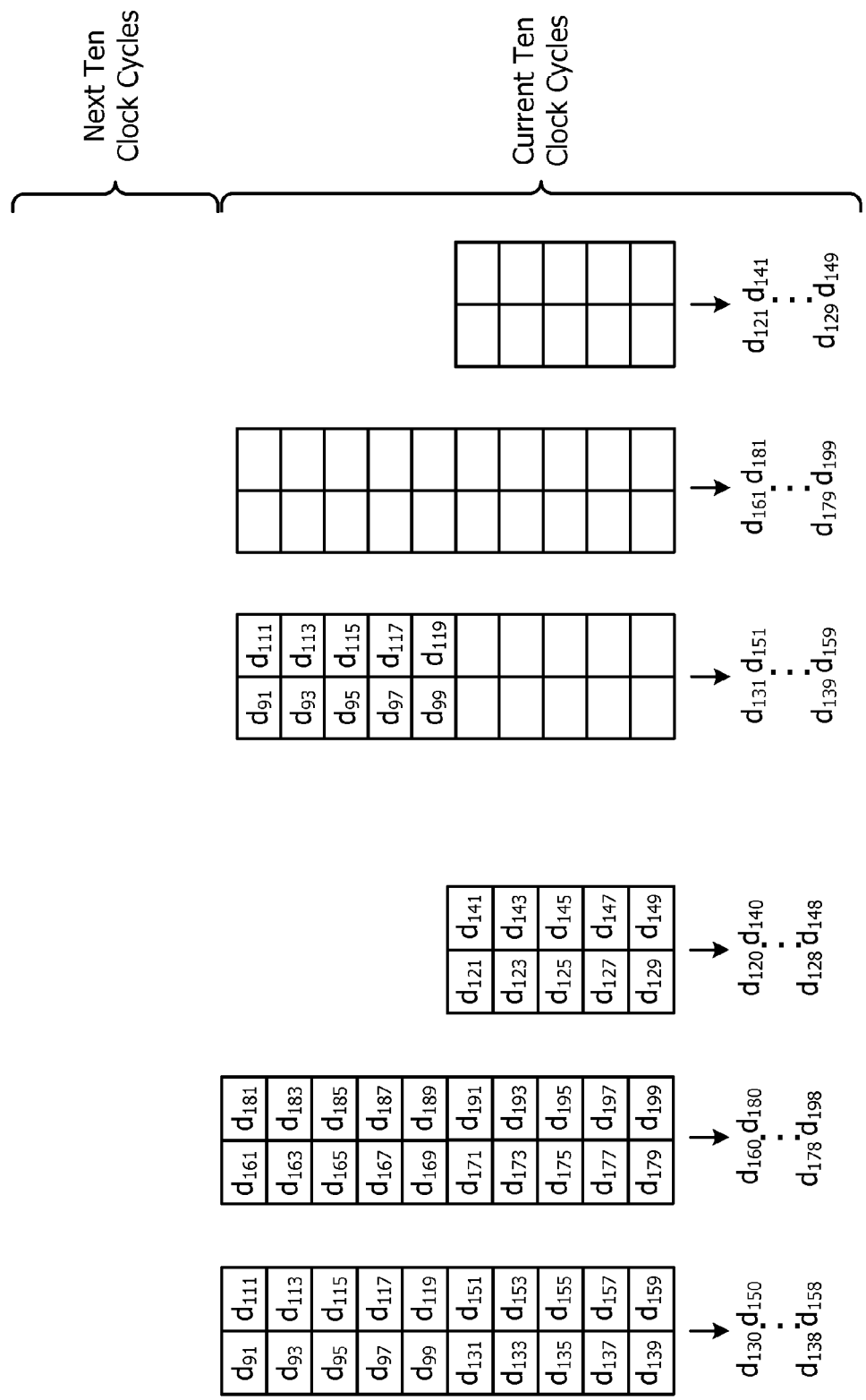

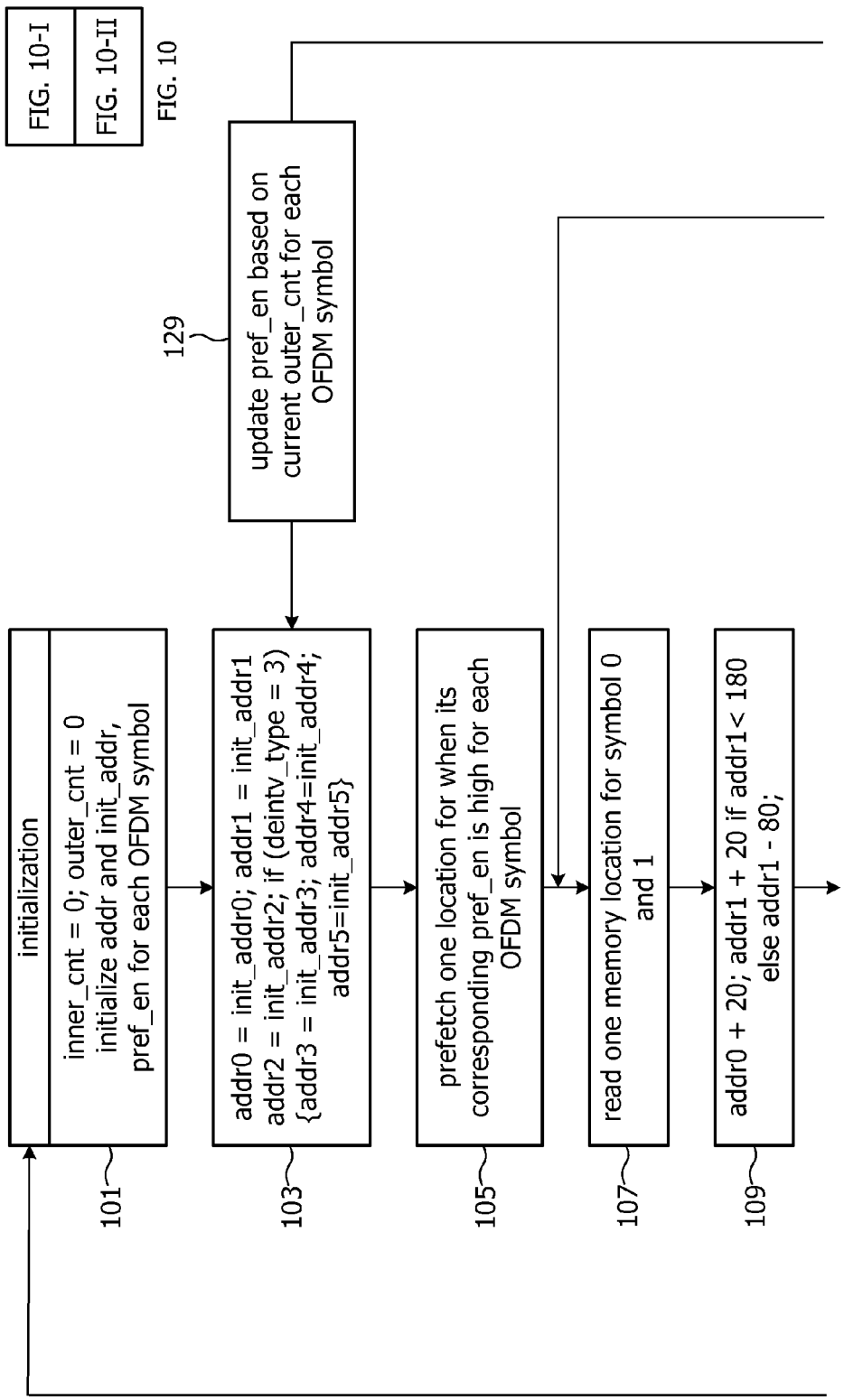

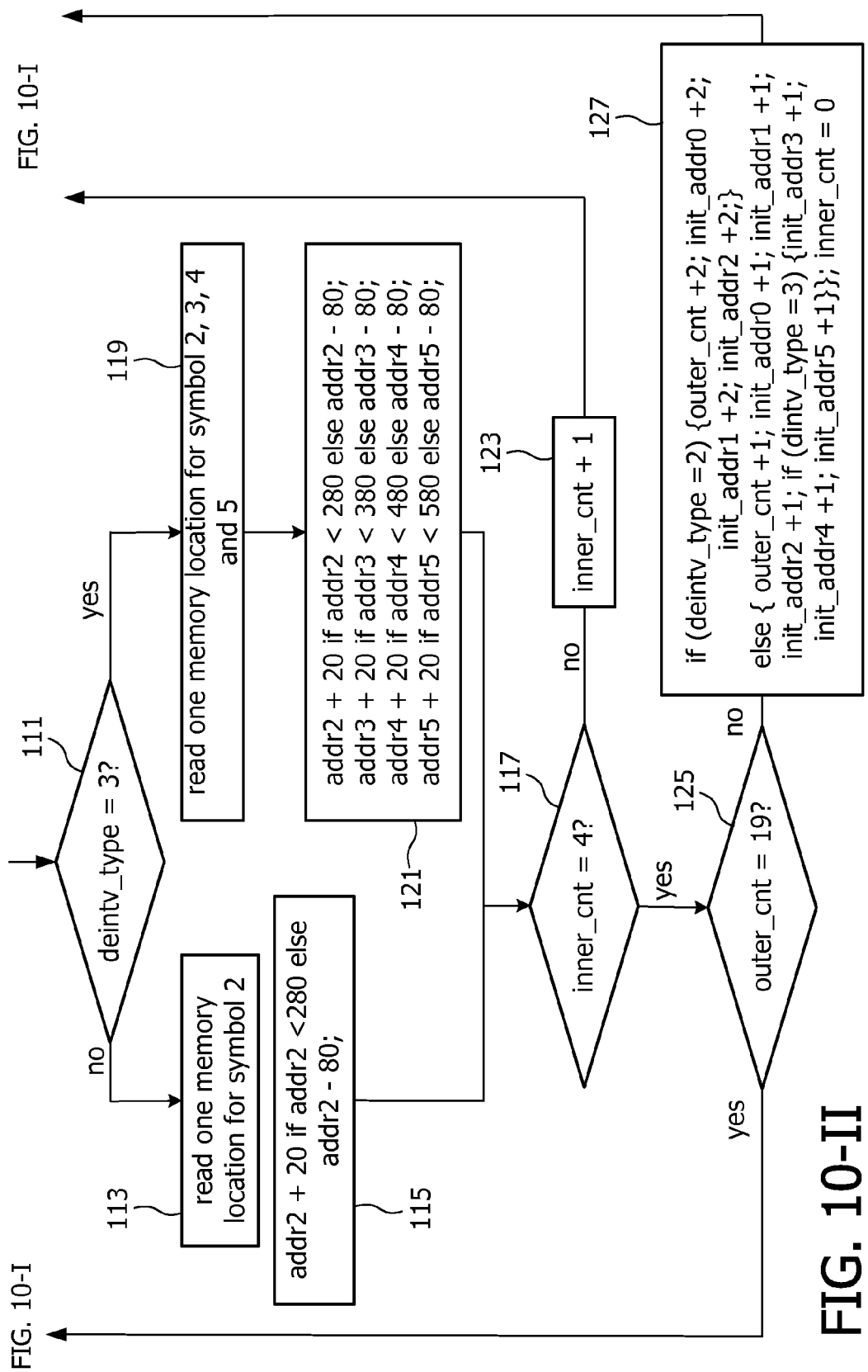
FIG. 10-II

| deintv_type | current symbol index | outer_cnt | value of pref_en |
|---|---|---|---|
| 1 or 2 | 0 | 0 - 19 | 0 |
| | 1 | 0 - 5 | 0 |
| | | 6 - 19 | 1 |
| | 2 | 0 - 11 | 0 |
| | | 12 - 19 | 1 |
| 3 | 0 | 0 - 19 | 0 |
| | 1 | 0 - 12 | 0 |
| | | 13 - 19 | 1 |
| | 2 | 0 - 5 | 0 |
| | | 6 - 19 | 1 |
| | 3 | 0 - 18 | 1 |
| | | 19 | 0 |
| | 4 | 0 - 11 | 1 |
| | | 12 - 19 | 0 |
| | 5 | 0 - 4 | 1 |
| | | 5 - 19 | 0 |

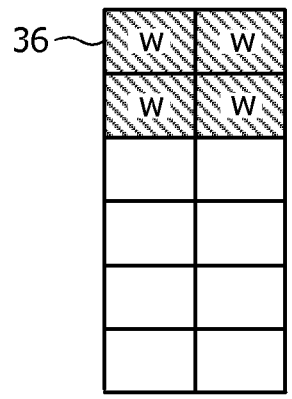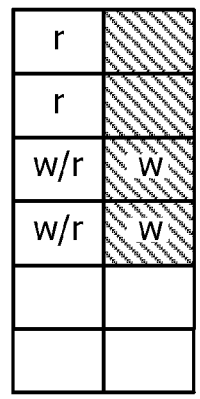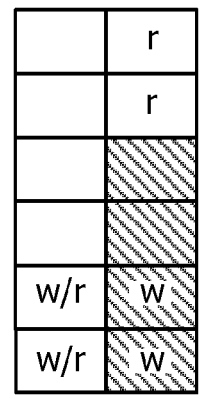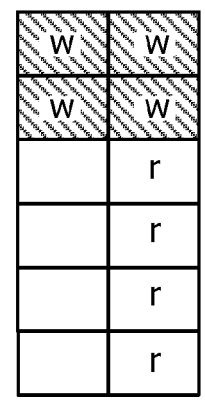
FIG. 13a  FIG. 13b  FIG. 13c
FIG. 13d

DEINTERLEAVER FOR A COMMUNICATION DEVICE

TECHNICAL FIELD OF THE INVENTION

The invention relates to a communication device, and in particular relates to a deinterleaver for a communication device.

BACKGROUND OF THE INVENTION

Interleaving techniques are commonly used in communication systems to protect transmissions against burst errors. Burst errors result in a number of consecutive bits being received erroneously, with the rest of the transmission being received successfully.

Data correction bits are derived for the data prior to transmission, which are used by the receiver to detect whether the data has been received successfully, and whether erroneously received bits can be corrected. Only a certain number of erroneous bits can be corrected in each symbol to be transmitted. Therefore, interleaving is used to spread the bits for each symbol across the transmission. Thus, if a burst error occurs, only a small number of bits from each symbol are affected, so the receiver will be able to correct the received symbols using the data correction bits.

In many established standards, for example wireless communication standards, block interleaving is used, as it is easy and straightforward to implement. However, as data rates and distances between nodes increase, nested or concatenated interleaving schemes are becoming more important. The direct mapping of deinterleavers for such advanced interleaving schemes to hardware is usually suboptimal, so different optimization techniques can be used to save silicon area and reduce power consumption.

The "MultiBand OFDM Physical Layer Specification" Release 1.0 from the MultiBand OFDM Alliance proposes a three-stage interleaving scheme. In the first stage, symbol interleaving is used which permutes the bits across a number of consecutive OFDM symbols (usually six) to exploit frequency diversity within a band group. In the second stage, intra-tone interleaving is used which permutes the bits across the data sub-carriers (tones) within an OFDM symbol to exploit frequency diversity across sub-carriers. In the third stage, intra-symbol cyclic shifts are used which cyclically shift the bits in successive OFDM symbols by deterministic amounts.

FIG. 1 shows a block diagram of an interleaver in accordance with the above scheme. The interleaver 2 comprises a symbol interleaving unit 4, a tone interleaving unit 6 and a cyclic shift unit 8 connected in series. The symbol interleaving unit 4 receives input bits denoted $\{U(i)\}$, operates on the bits and outputs bits denoted $\{S(i)\}$. The tone interleaving unit 6 receives the bits denoted $\{S(i)\}$, operates on the bits and outputs bits denoted $\{V(i)\}$. The cyclic shift unit 8 receives the bits denoted $\{V(i)\}$, operates on the bits and outputs bits denoted $\{B(i)\}$.

The symbol interleaving operation performed by symbol interleaving unit 4 comprises dividing the coded bits into blocks of $6N_{CBPS}$ coded bits, where $N_{CBPS}$ is the number of coded bits per symbol, and therefore $6N_{CBPS}$ corresponds to six OFDM symbols. Each group of coded bits is then permuted using a block interleaver of size $6N_{CBPS}$ by $6/N_{TDS}$, where $N_{TDS}$ is the time spreading factor. The sequences $\{U(i)\}$ and $\{S(i)\}$, where $i=0, \ldots, N_{CBP6S}-1$ and $N_{CBP6S}$ is the number of coded bits in six symbols, represent the input and output bits of the symbol interleaving unit 4 respectively. The input-output relationship of this unit is given by the equation $$S(i) = U\left\{\text{Floor}\left(\frac{i}{N_{CBPS}}\right) + \frac{6}{N_{TDS}}\text{Mod}(i, N_{CBPS})\right\}, \quad (1)$$

where Floor(x) is a function which returns the largest integer value less than or equal to its argument value, and Mod(x,y) is the modulus operator which returns the non-negative integer remainder when x is divided by y.

The output bits of the symbol interleaving unit 4, which are grouped together into blocks of $N_{CBP6S}$ bits, are permuted together using a regular block interleaver of size $N_{Tint} \times 10$, where $N_{Tint} = N_{CBPS}/10$. The sequences $\{S(i)\}$ and $\{V(i)\}$, where $i=0, \ldots, N_{CBP6S}-1$, represent the input and output bits of the tone block interleaver unit 6 respectively. The input-output relationship of this unit is given by the equation $$V(i) = S\left\{\text{Floor}\left(\frac{i}{N_{Tint}}\right) + 10\text{Mod}(i, N_{Tint})\right\}, \quad (2)$$

The output of the tone interleaving unit 6 is passed through intra-symbol cyclic shift unit 8. The sequences $\{V(i)\}$ and $\{B(i)\}$, where $i=0, \ldots, N_{CBP6S}-1$, represent the input and output bits of the cyclic shift unit 8 respectively. The output of the cyclic shift unit 8 is given by the following equation $$B(i) = V[m(i) \times N_{CBPS} + \text{mod}(i + m(i) \times N_{cyc}, N_{CBPS})] \quad (3)$$

where $m(i) = \text{Floor}(i/N_{CBPS})$ and $i=0, \ldots, N_{CBP6S}-1$.

US 2005/0152327 discloses an interleaver for a multiband OFDM transceiver of an ultra wideband personal access network in accordance with the above three-stage interleaving scheme. This document also describes a deinterleaver which is a concatenation of three blocks, a cyclic de-shift unit, a tone-deinterleaving unit and a symbol deinterleaving unit, which is costly in terms of silicon area and is not scalable.

SUMMARY OF THE INVENTION

It is an object of the invention to provide a deinterleaver for a wireless communication device that is simple and inexpensive to implement.

In accordance with a first aspect of the invention, there is provided a deinterleaver for deinterleaving a stream of data bits representing a plurality of symbols that have been interleaved using a multi-stage interleaving scheme, the deinterleaver comprising preprocessing means for ordering the data bits in the stream into pairs, such that the data bits in the pair are consecutive data bits from a symbol; at least one memory for storing the paired bits, such that each pair of data bits is stored in a respective location in the memory; and a read and write address generator for the at least one memory, the generator being adapted to determine the addresses in the at least one memory that pairs of data bits are to be stored, and to determine the addresses in the at least one memory that pairs of data bits are to be read from.

In accordance with a second aspect of the invention, there is provided a device for use in an ultra-wideband system comprising a deinterleaver as described above.

In accordance with a third aspect of the invention, there is provided a communication device for use in receiving a stream of data bits representing a plurality of symbols, the device comprising a deinterleaver as described above.

These and other aspects of the invention will be apparent from and elucidated with reference to the embodiments described hereinafter.

BRIEF DESCRIPTION OF THE DRAWINGS

The invention will now be described, by way of example only, with reference to the following drawings, in which:

FIGS. 3(a), 3(b) and 3(c) show initial output addresses at the deinterleaver for different values of deintv_type;

FIG. 4(a), 4(b) and 4(c) show symbol bits in initial output addresses at the deinterleaver for different values of deintv_type.

FIG. 8(a) to 8(f) illustrate the operation of the preprocessing unit when deintv_type=2;

FIG. 9(a) to 9(g) illustrate the operation of the preprocessing unit when deintv_type=3;

FIG. 10 is a flow chart showing the operation of a read/write address generator in accordance with the invention;

FIG. 13(a)-(d) illustrate the operation of the inter-symbol post-processing unit in accordance with the invention.

DETAILED DESCRIPTION OF THE PREFERRED EMBODIMENTS

Although the invention will be described with reference to an ultra-wideband network in accordance with the "Multi-Band OFDM Physical Layer Specification" Release 1.0 from the MultiBand OFDM Alliance mentioned above, it will be appreciated that the invention is applicable to other communication networks in which multi-level interleaving is used.

In the following description of the invention, it is assumed that data to be transmitted has been interleaved using the three-stage interleaving scheme described above with reference to FIG. 1 and Equations (1), (2) and (3), with the data being interleaved over six symbols, or three symbols (with the above equations being modified accordingly).

Figures 1, 2:
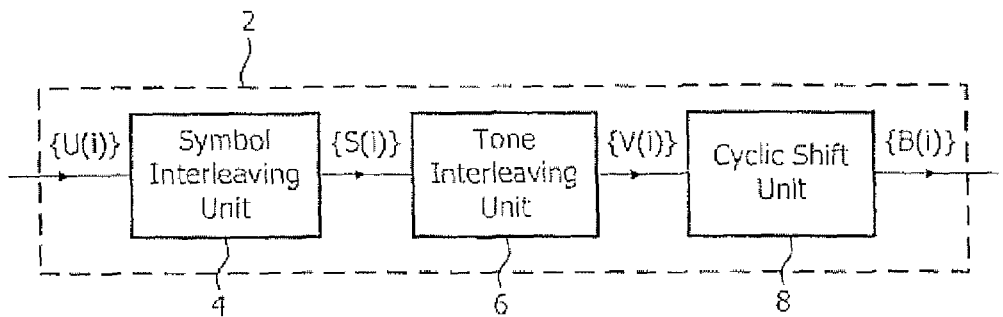
FIG. 1 is a block diagram of a conventional three-stage interleaver.
FIG. 2 is a table showing data-rate dependent parameters used in an interleaver.

In the exemplary network, there are nine possible data rates that can be used: 39.4 Mb/s, 53.3 Mb/s, 80 Mb/s, 106.7 Mb/s, 160 Mb/s, 200 Mb/s, 320 Mb/s, 400 Mb/s and 480 Mb/s. The data rate 39.4 Mb/s is just used for the header. The parameters $N_{TDS}$, $N_{Tint}$, $N_{cyc}$ and $N_{CBPS}$ used in the interleaving scheme described above all depend on the data rate being used at that time. FIG. 2 is a table showing exemplary values for the parameters.

It has been recognized that the order in which symbol data bits are output from an interleaver can be classified into three main types based on the data rate and other parameters used by the interleaver to interleave the data stream. Thus, in accordance with the invention, a new parameter deintv_type is defined, and its value is based on the data rate used to transmit the data stream. The parameter deintv_type has a value of 1 when the data rate is 39.4 Mb/s, 53.3 Mb/s and 80 Mb/s, a value of 2 when the data rate is 106.7 Mb/s, 160 Mb/s and 200 Mb/s, and a value of 3 when the data rate is 320 Mb/s, 400 Mb/s and 480 Mb/s. The values of deintv_type are shown in FIG. 2.

The number of symbols used in the interleaving at the transmitter is denoted M and has the value M=0, . . . , 2 for data rates less than 320 Mb/s and M=0, . . . , 5 for data rates greater than 200 Mb/s (the range of values for M are also shown in the table of FIG. 2). Assuming that the input data to the deinterleaver architecture is written in a continuous way, the soft bits from the $M^{th}$ symbol will be written into addresses N*M to N*(M+1)−1, where N=$N_{CBPS}$.

FIGS. 3(a), 3(b), 3(c), 4(a), 4(b) and 4(c) show the natural order in which interleaved symbol bits are received at a deinterleaver for different values of deintv_type. Specifically, FIGS. 3(a), 3(b) and 3(c) show the ordering of data bits and how they are virtually stored in memory at the deinterleaver for deintv_type=1, 2 and 3 respectively. The $m^{th}$ bit of the $M^{th}$ symbol is denoted $sym_{M,m}$. FIGS. 4(a), 4(b) and 4(c) show the ordering of data bits in the virtual memory addresses.

In a preferred embodiment, two data bits can be stored in a single physical memory location, with the virtual address being mapped to a physical address by dividing by It can be seen from FIGS. 3(a), 3(b) and 3(c) that there are three patterns in the output addresses.

(i) The first pattern is that the data from each symbol is output in a round robin way. For example, the output will be $sym_{0,m}$, $sym_{1,m}$, $sym_{2,m}$, $sym_{0,m+1}$, $sym_{1,m+1}$, $sym_{2,m+1}$, etc. This is due to the symbol-interleaving unit 4 in the transmitter.

(ii) If two consecutive output addresses from the same symbol are grouped together starting from the first output address, it can be seen that for most of the groups, the address gap is 10 for data rates of 39.4 Mb/s, 53.3 Mb/s and 80 Mb/s and 20 for data rates greater than 80 Mb/s. For example, the address gap between $sym_{0,0}$ and $sym_{0,1}$ in FIG. 3(a) is 10. This is due to the intra-symbol tone-interleaving block 6 in the transmitter.

(iii) The pattern described in (ii) may occasionally be broken, but, in these cases, another pattern is available. Here, two consecutive samples have index of m, (m+gap)−M*N. This is shown in FIG. 3(b) where the addresses of two consecutive data bits are 588 ($sym_{2,6}$) and 408 ($sym_{2,7}$). This is due to the cyclic shift unit 8 in the transmitter.

Figure 5:
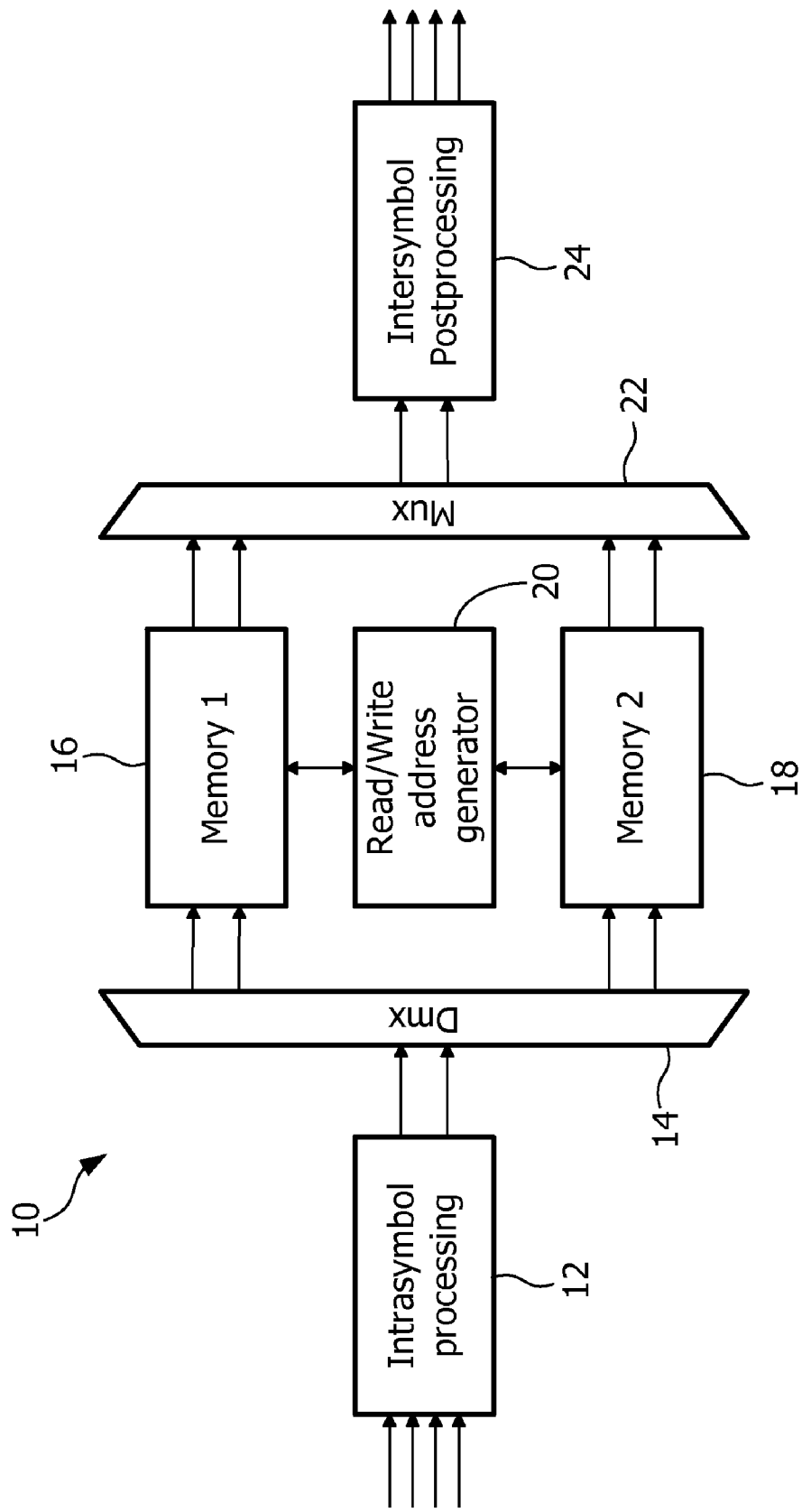
FIG. 5 is a block diagram of an architecture for a deinterleaver in accordance with the invention.

As a result of the above observations, a deinterleaver 10 is presented in FIG. 5. The deinterleaver 10 comprises an intra-symbol preprocessing unit 12, which preprocesses the incoming interleaved data stream by reordering the data stream to the pattern in paragraph (ii). The intra-symbol preprocessing unit 12 has an output to a demultiplexer 14, which selectively outputs the preprocessed data stream to a first memory 16 or a second memory 18. In a preferred embodiment, the first and second memories 16, 18 may be dual port random access memories. A read/write address generator 20 determines the locations in the first and second memories 16, 18 to which data is to be written to or read from. A multiplexer 22 is connected to the output of the first and second memories 16, 18 and selectively passes the output of one of the memories 16, 18 to an inter-symbol post-processing unit 24. The inter-symbol post-processing unit 24 reorders the data received from the respective memory 16 or 18 selected by the multiplexer 22 to the pattern in FIG. 3(a) or FIG. 3(c). This architecture allows symbol and bit deinterleaving to be carried out at the same time.

The deinterleaver 10 preferably comprises control means that determines the value of deintv_type for the incoming transmission from the indication of the data rate in the header of the packet. In some embodiments, this header is a PLCP header.

At any time, one of the memories 16 or 18 is responsible for writing soft bits received in the incoming data stream, and the other is responsible for reading out soft bits stored therein. The memories 16, 18 switch responsibilities after 6 OFDM symbol periods. In a preferred embodiment where each memory location stores two data bits, the memories 16, 18 each have $3*N_{CBPS}$ memory locations, one location for each pair of bits in six symbols.

Figure 6:
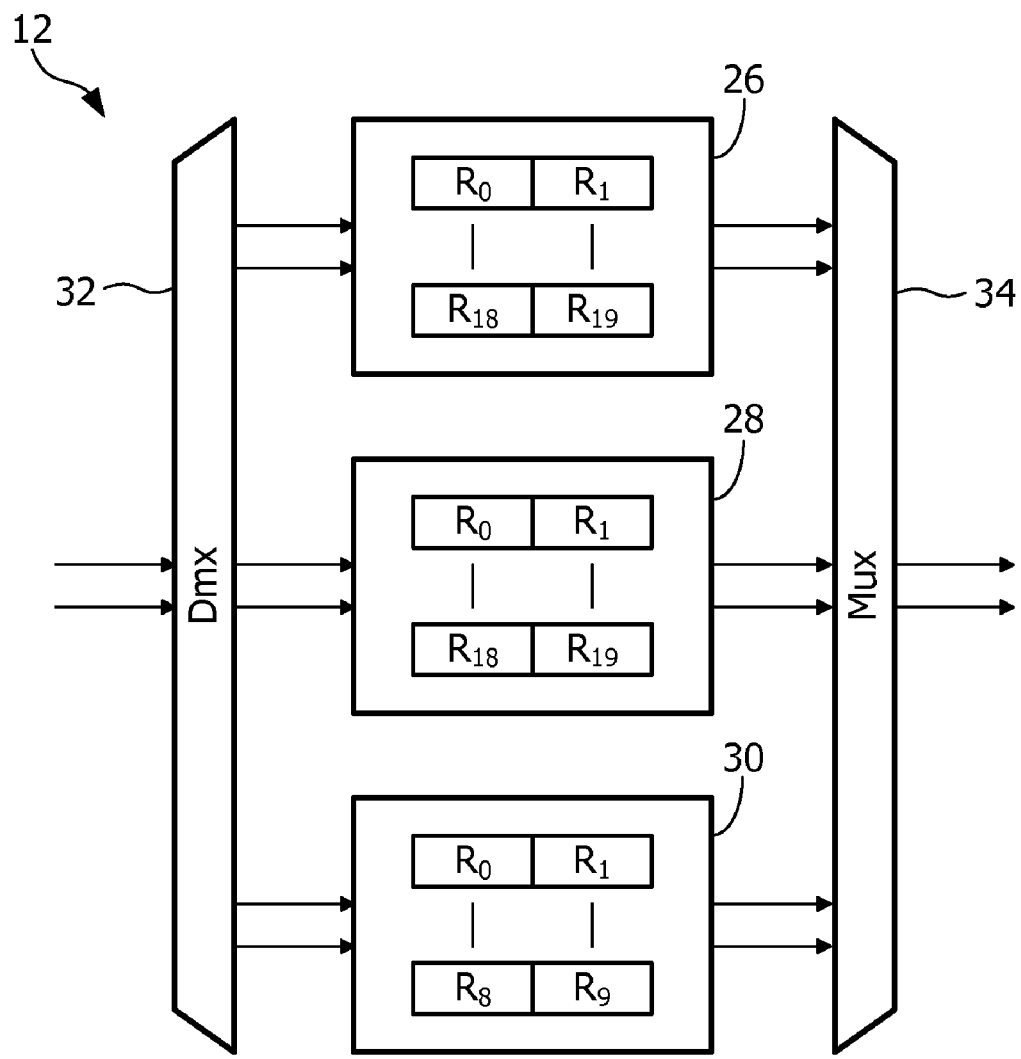
FIG. 6 shows a block diagram of an intra-symbol preprocessing unit in accordance with the invention.

FIG. 6 shows a block diagram of an intra-symbol preprocessing unit 12 in accordance with the invention. The unit 12 comprises three register arrays, a first main register array 26, a second main register array 28 and a special register array 30. The first and second main register arrays 26, 28 have twenty register locations, labeled $R_0$ to $R_{19}$. The special register array 30 has ten register locations, labeled $R_0$ to $R_9$. The preprocessing unit 12 further comprises a demultiplexer 32 for receiving the data stream at the input of the unit 12 and selectively outputting the data stream to one of the register arrays 26, 28 or 30. The unit 12 also comprises a multiplexer 34 for outputting data from a selected register array 26, 28 and 30.

The intra-symbol preprocessing unit 12 has three different operating modes, one for each of the possible values for deintv_type. Due to frequency domain de-spreading, two soft data bits will be input to the preprocessing unit 12 each clock cycle when deintv_type=1. As the deinterleaver is a parallel design, four soft bits will be input to the preprocessing unit 12 each clock cycle when deintv_type=2 or 3.

FIGS. 7(a) to 7(g) illustrate the operation of the preprocessing unit 12 when deintv_type=1. When deintv_type=1, only the first main register array 26 is used to process the incoming data stream. Thus the demultiplexer 32 is controlled to direct the incoming data stream to the first main register array 26, and the multiplexer 34 is controlled to select the first main register array 26 for the output of the preprocessing unit 12. The second main register array 28 and the special register array 30 are not used when deintv_type=1.

As mentioned above, the intra-symbol preprocessing unit 12 processes the incoming data stream and outputs the data bits in accordance with the pattern described in paragraph (ii) above. That is, the unit 12 groups the data stream into pairs of bits whose indices are 10 apart.

Each of FIGS. 7(a)-(g) show the state of the register 26 at the end of a single clock cycle. Illustrated above the register 26 are a pair of data bits $d_x d_{x+1}$ which will be received in the next clock cycle. The pair of data bits $d_y d_{y+10}$ illustrated below the register 26 are the data bits output from the register 26 during the clock cycle represented by that Fig.

Figures 7A, 7B, 7C, 7D:
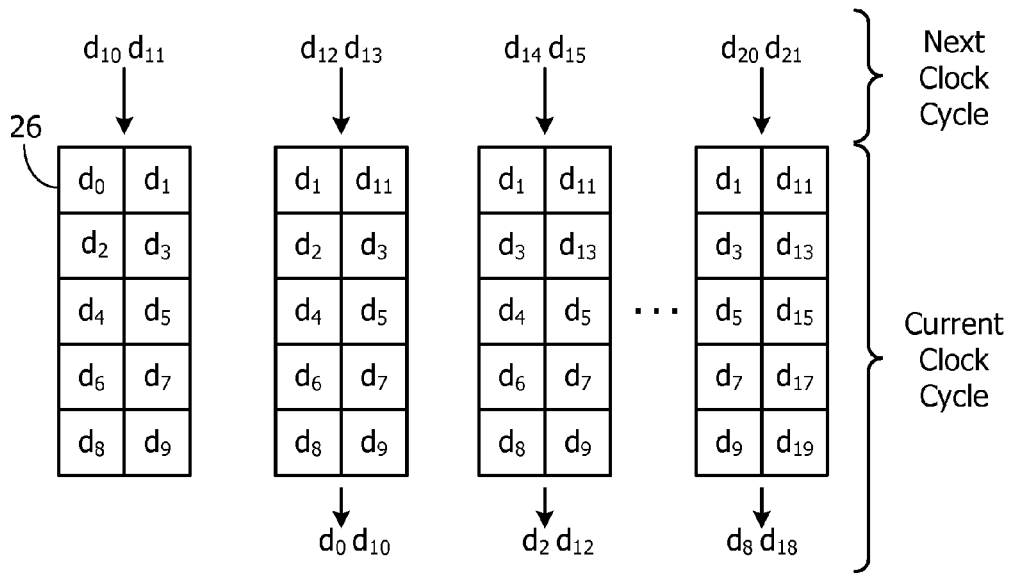
FIG. 7(a) to 7(g) illustrate the operation of the preprocessing unit when deintv_type=1.

FIG. 7(a) shows that the first ten data bits, denoted $d_0$ to $d_9$, have been stored in locations $R_0$ to $R_9$ respectively in the register 26. In the next clock cycle, data bits $d_{10}$ and $d_{11}$ will be received. It will be noted that register locations $R_{10}$ to $R_{19}$ are not used when deintv_type=1.

The operation of the register 26 follows a set pattern, with the pattern repeating every twenty data bits received, or, in other words, every ten clock cycles.

In each of the first five clock cycles of the pattern, when a new pair of data bits are received at the register 26, a first one of the pair of data bits is read straight out of the register along with a data bit previously stored in the register 26. This data bit will have an index that is ten less than the first data bit in the incoming pair. The other data bit in the pair is read into a vacant register location in the register 26.

So, as shown in FIG. 7(b), the incoming data bit $d_{10}$ is read straight out of the register 26 with data bit $d_0$, which was stored in register location $R_0$. Data bit $d_1$ in register location $R_1$ is moved to register location $R_0$, and incoming data bit $d_{11}$ is stored in register location $R_1$. Alternatively (but not illustrated), data bit $d_1$ may remain in register location $R_1$, and incoming data bit $d_{11}$ can be stored in register location $R_0$. In either case, a pair of data bits whose indices are 10 apart are output from the register 26 to one of the first or second memories 16, 18, via the multiplexer 34 and demultiplexer 14. In the register 26, data bits $d_1$ and $d_{11}$ are now stored in adjacent register locations.

In FIG. 7(c), the data bits $d_{12}d_{13}$ are received at the register 26. Data bit $d_{12}$ is read straight out of the register 26 with data bit $d_2$, which was stored in register location $R_2$. Data bit $d_3$ moves to register location $R_2$, and the incoming data bit $d_{13}$ is stored in the adjacent register location $R_3$.

As shown in FIG. 7(d), after the first five cycles of the pattern, each consecutive pair of register locations has a respective pair of data bits stored therein, with the data bits having indices that are 10 apart. Thus, register locations $R_6$ and $R_7$ have data bits $d_7$ and $d_{17}$ stored therein, and so on.

In the last five clock cycles of the pattern, pairs of data bits stored in consecutive register locations are read out of the register 26, and both of the incoming data bits are stored in the vacated register locations.

Figures 7E, 7F, 7G:
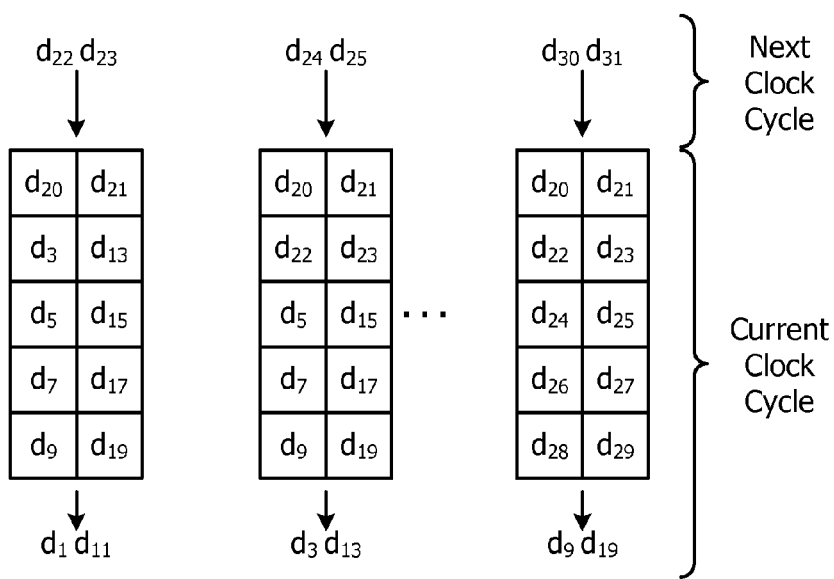
Figure 9G:
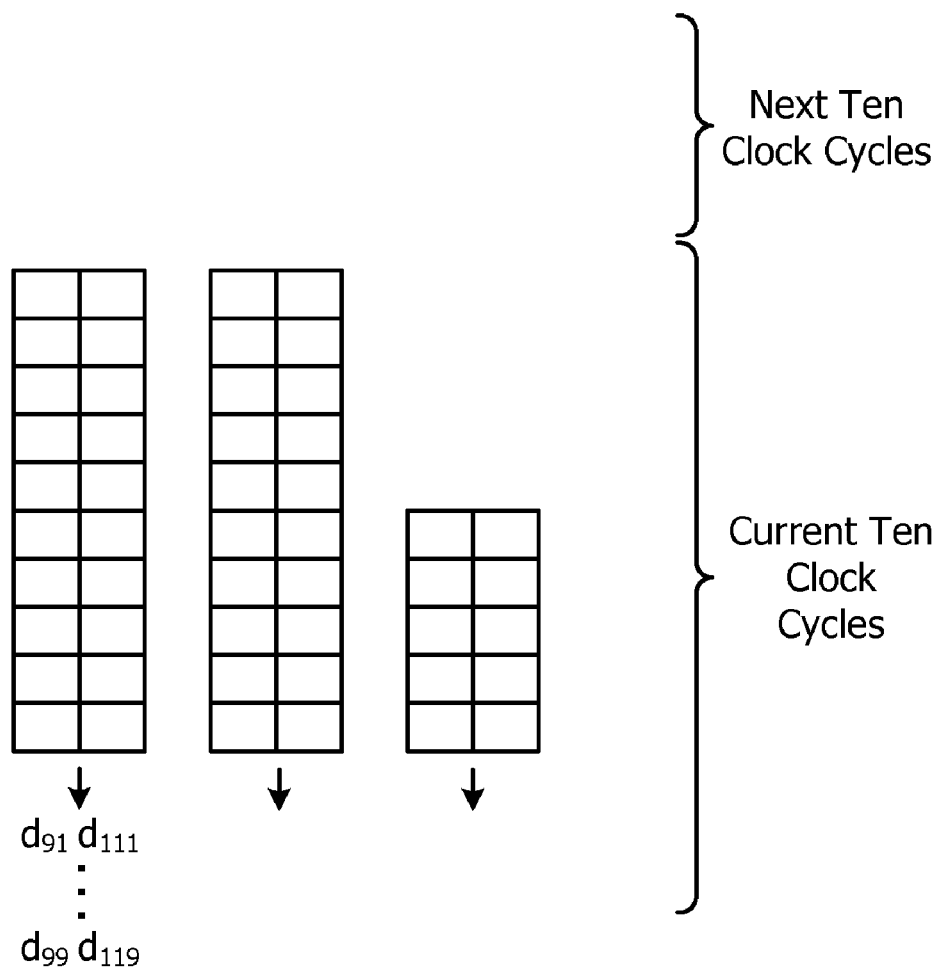

Thus, in FIG. 7(e), the data bits $d_1$ and $d_{11}$ in consecutive register locations $R_0$ and $R_1$ respectively are read out of the register 26 to one of the first or second RAMs 16, 18, and the incoming pair of data bits $d_{20}$ and $d_{21}$ are stored in the now-vacant register locations $R_0$ and $R_1$. This process continues as shown in FIG. 7(f).

After the tenth clock cycle of the pattern, the state of the register 26 will be as shown in FIG. 7(g). Thus, consecutive data bits $d_{20}$ to $d_{29}$ have been stored in respective register locations $R_0$ to $R_9$, and each of data bits $d_0$ to $d_9$ have been read out of the register 26 with a corresponding data bit that has an index that is 10 higher. It can be seen that the state of the register 26 in FIG. 7(g) corresponds to the state of the register 26 in FIG. 7(a). Thus, the pattern of ten clock cycles repeats for the remainder of the incoming data stream.

FIGS. 8(a) to 8(f) illustrate the operation of the preprocessing unit 12 when deintv_type=2. As when deintv_type=1, only the first main register array 26 is used to process the incoming data stream. The second main register array 28 and the special register array 30 are not used when deintv_type=2.

As mentioned above, the intra-symbol preprocessing unit 12 processes the incoming data stream and outputs the data bits in accordance with the pattern described in paragraph (ii) above. Thus, the unit 12 groups the data stream into pairs of bits whose indices are 20 apart.

In order to reduce the number of figures required to illustrate the operation of the preprocessing unit 12 when deintv_type=2, each of FIGS. 8(a)-(f) show the state of the register 26 at the end of a clock cycle. As the deinterleaver 10 is a parallel design (which allows the clock speed to be decreased, for example from 528 MHz to 264 MHz), four soft data bits will be input to the preprocessing unit 12 each clock cycle, and illustrated above the register 26 are two pairs of data bits $d_x d_{x+1} d_{x+2} d_{x+3}$ which will be received during the next clock cycle. The two pairs of data bits $d_y d_{y+20} d_{y+2} d_{y+22}$ illustrated below the register 26 are the data bits output from the register 26 during the clock cycle represented by that Fig.

FIG. 8(a) shows that the first twenty data bits, denoted $d_0$ to $d_{19}$, have been stored in locations $R_0$ to $R_{19}$ respectively in the register 26. In the next clock cycle, data bits $d_{20}$, $d_{21}$, $d_{22}$ and $d_{23}$ will be received.

As when deintv_type=1, the operation of the register 26 follows a set pattern, with the pattern repeating every forty data bits received, or, in other words, every ten clock cycles.

In each of the first five clock cycles of the pattern, when a new quartet of data bits are received at the register 26, the first and third ones of the quartet of data bits are read straight out of the register along with two data bits previously stored in the register 26. These data bits will have an index that is twenty less than the first and third data bits in the incoming quartet respectively. The other data bits in the quartet are read into vacant register locations in the register 26.

As shown in FIG. 8(b), the incoming data bits $d_{20}$ and $d_{22}$ are read straight out of the register 26 with respective data bits $d_0$ and $d_2$, which were stored in respective register locations $R_0$ and $R_2$. Data bits $d_1$ and $d_3$ in respective register locations $R_1$ and $R_3$ are moved to register locations $R_0$ and $R_2$, and incoming data bits $d_{21}$ and $d_{23}$ are stored in register locations $R_1$ and $R_3$ respectively. Alternatively (but not illustrated), data bits $d_1$ and $d_3$ may remain in respective register locations $R_1$ and $R_3$, and incoming data bits $d_{21}$ and $d_{23}$ can be stored in respective register locations $R_0$ and $R_2$. In either case, two pairs of data bits whose indices are 20 apart are output from the register 26 each clock cycle to one of the first or second memories 16, 18, via the multiplexer 34 and demultiplexer 14. In the register 26, data bits $d_1$ and $d_{21}$ and $d_3$ and $d_{23}$ are now stored in adjacent register locations.

This process continues as shown in FIG. 8(c). FIG. 8(d) shows the state of the register 26 after five clock cycles. Each consecutive pair of register locations has a respective pair of data bits stored therein, with the data bits having indices that are 20 apart. Thus, register locations $R_6$ and $R_7$ have data bits $d_7$ and $d_{27}$ stored therein, and so on.

In the last five clock cycles of the pattern, two pairs of data bits stored in consecutive register locations are read out of the register 26, and all four of the incoming data bits are stored in the vacated register locations.

Thus, in FIG. 8(e), the data bits $d_1$ and $d_{21}$ in consecutive register locations $R_0$ and $R_1$ respectively are read out of the register 26 to one of the first or second RAMs 16, 18, and the incoming pair of data bits $d_{40}$ and $d_{41}$ are stored in the now-vacant register locations $R_0$ and $R_1$. This process continues, until the tenth clock cycle in the pattern, when the state of the register 26 is as shown in FIG. 8(f).

After the tenth clock cycle of the pattern, consecutive data bits $d_{40}$ to $d_{59}$ have been stored in respective register locations $R_0$ to $R_{19}$, and each of data bits $d_0$ to $d_{19}$ have been read out of the register 26 with a corresponding data bit that has an index that is 20 higher. It can be seen that the state of the register 26 in FIG. 8(f) corresponds to the state of the register 26 in FIG. 7(a). Thus, the pattern of ten clock cycles repeats for the remainder of the incoming data stream.

FIGS. 9(a) to 9(g) illustrate the operation of the preprocessing unit 12 when deintv_type=3.

According to the Wimedia PHY specification, when the data rate is higher than 200 Mb/s, i.e. when deintv_type=3, dual carrier modulation is used. In a dual carrier modulator, two hundred incoming bits are grouped into fifty groups of four bits, which are modulated on two sub-carriers. At the dual carrier demodulator (which is not shown in FIG. 5), the output bits are also in groups. Based on a data stream comprising bits $d_0, d_1, d_2, \ldots$, the data stream is output from the dual carrier demodulator in the order $d_0, d_1, d_{50}, d_{51}, d_2, d_3, \ldots$.

As when deintv_type=1 or 2, the intra-symbol preprocessing unit 12 processes the incoming data stream and outputs the data bits in accordance with the pattern described in paragraph (ii) above. Thus, the unit 12 groups the data stream into pairs of bits whose indices are 20 apart.

However, as a result of the operation of the dual carrier demodulator when deintv_type=3, the processing required to group the data bits is more complicated than when deintv_type=1 or 2. Thus, the intra-symbol preprocessing unit 12 uses all three of the first main register array 26, the second main register array 28 and the special register array 30 to process the incoming data stream.

In order to reduce the number of figures required to illustrate the operation of the preprocessing unit 12 when deintv_type=3, each of FIGS. 9(a)-(g) show the state of the registers 26, 28 and 30 at the end of every ten clock cycles. As four soft data bits will be input to the preprocessing unit 12 each clock cycle, illustrated above the registers 26, 28 and 30 are twenty pairs of data bits $d_x d_{x+1}$. Due to the nature of the output of the dual carrier demodulator mentioned above, the forty data bits will not be consecutively numbered (i.e. they will not be in the order $d_x \ldots d_{x+40}$). The twenty pairs of data bits $d_y d_{y+20}$ illustrated below the registers 26, 28 and 30 are the data bits output from those registers during the ten clock cycles represented by that Fig.

FIG. 9(a) shows that the first forty data bits, denoted $d_0$ to $d_{19}$ and $d_{50}$ to $d_{69}$ have been received at the preprocessing unit 12 and have been directed by the demultiplexer 32 to appropriate locations in the first main register array 26, second main register array 28 and special register array 30. Data bits $d_0$ to $d_{19}$ have been stored in locations $R_0$ to $R_{19}$ respectively in the first main register array 26, data bits $d_{50}$ to $d_{59}$ have been stored in locations $R_0$ to $R_9$ respectively in the second main register array 28, and data bits $d_{60}$ to $d_{69}$ have been stored in locations $R_0$ to $R_9$ respectively in the special register array 30. In the next ten clock cycles, data bits $d_{20} \ldots d_{39}$ and $d_{70} \ldots d_{89}$ will be received.

As shown in FIG. 9(b), the incoming data bits with even indices $d_{20}, d_{22}, \ldots, d_{38}$ are read straight out of the register 26 with respective data bits with even indices $d_0, d_2, \ldots, d_{18}$ which were stored in respective even-numbered register locations $R_0, R_2, \ldots, R_{18}$. Data bits with odd indices $d_1, d_3, \ldots, d_{19}$ in respective odd-numbered register locations $R_1, R_3, \ldots, R_{19}$ are moved to newly vacated even-numbered register locations $R_0, R_2, \ldots, R_{18}$, and incoming data bits with odd indices $d_{21}, d_{23}, \ldots, d_{39}$ are stored in respective locations $R_1, R_3, \ldots, R_{19}$ in the first main register array 26. Alternatively (but not illustrated), the data bits with odd indices in the first main register array 26 may remain in their respective register locations, and the incoming data bits with odd indices $d_{21}, d_{23}, \ldots, d_{39}$ can be stored in respective even-numbered register locations $R_0, R_2, \ldots, R_{18}$. In either case, two pairs of data bits whose indices are 20 apart are output from the register 26 each clock cycle to one of the first or second memories 16, 18, via the multiplexer 34 and demultiplexer 14. In the register 26, each data bit is stored adjacent to a data bit whose index differs from that first data bit by 20.

In addition to the above operation of the first main register array 26, incoming data bits $d_{70}, d_{72}, \ldots, d_{78}$ are read straight out of the second main register array 28 with respective data bits $d_{50}, d_{52}, \ldots, d_{58}$ which were stored in respective even-numbered register locations $R_0, R_2, \ldots, R_8$ in register 28. Data bits $d_{51}, d_{53}, \ldots, d_{59}$ in respective odd-numbered register locations $R_1, R_3, \ldots, R_9$ are moved to the newly vacated even-numbered register locations $R_0, R_2, \ldots, R_8$ in register 28, and incoming data bits $d_{71}, d_{73}, \ldots, d_{79}$ are stored in respective locations $R_1, R_3, \ldots, R_9$. The remaining incoming data bits, $d_{80}, \ldots, d_{89}$ are stored in register locations $R_{10}, \ldots, R_{19}$ in the second main register array 28.

The process continues as shown in FIGS. 9(c)-(g) with two pairs of consecutive data bits being written into one of the registers 26, 28 or 30 each clock cycle, and two pairs of data bits whose indices differ by 20 being read out of one of the registers 26, 28 or 30, until all of the incoming data stream has been processed. It should be noted that as there is a gap between symbols at the input of the deinterleaver, the indicated register locations in FIGS. 9(f) and (g) are kept empty until all two hundred bits of the current symbol are processed.

In an alternative embodiment, if there is a reordering block after or in the dual carrier demodulator, the data stream can be provided to the deinterleaver in a natural order, i.e. $d_0, d_1, d_2, d_3, d_4, \ldots$. Therefore, it is not necessary for the intra-symbol preprocessing unit 12 to use the second main register array 28 or the special register array 30. Instead, the operation of the preprocessing unit 12 will be as shown in FIGS. 8(a)-(f) for deintv_type=2.

As described above, the output from the intra-symbol preprocessing unit 12 each clock cycle is a pair of data bits, whose indices differ by 10 when deintv_type=1, or by 20 when deintv_type=2 or 3. Due to the high throughput requirement of the deinterleaver 10, and the limited access speed of current memories (particularly CMOS memories), each pair of soft bits output by the preprocessing unit 12 are stored at a single memory address in one of the first or second memories 16, 18.

Also as described above, at any one time, one of the memories 16, 18 will be receiving and storing pairs of data bits from the preprocessing unit 12 for a current set of six symbols, while the other memory 16, 18 will be outputting pairs of data bits for a set of six symbols that have been previously stored in the memory 16, 18.

The read/write address generator 20 determines the locations in the first and second memories 16, 18 to which data is to be written to or read from. As described, the read/write generator controls the memory 16, 18 that are receiving pairs of data bits from the intra-symbol preprocessing unit 12 so that the bits for each OFDM symbol are stored at appropriate addresses in the memory 16, 18.

When deintv_type=1, the write address for the data bits $d_x d_{x+10}$ in the $M^{th}$ symbol in the first or second memory 16, 18 is determined from the following equation:

$$2\text{Mod}(x, 20) + 20\text{Floor}\left(\frac{x}{20}\right) + 100M \quad (4)$$

where Mod(x,y) is the modulus operator which returns the non-negative integer remainder when x is divided by y, and Floor(z) is the floor function which returns the largest integer value less than or equal to its argument value.

When deintv_type=2 or 3, the write address for the data bits $d_x d_{x+20}$ in the $M^{th}$ symbol in the first or second memory 16, 18 is determined from the following equation:

$$\text{Mod}(x, 40) + 20\text{Floor}\left(\frac{x}{40}\right) + 100M \quad (5)$$

However, the read address generator that generates the addresses that data is to be read from is more complicated.

Essentially, the address generator 20 uses a pre-fetching mechanism to deal with the cyclic shift in the third stage of the interleaver. When pre-fetching is enabled for the current OFDM symbol, the corresponding memory location is first pre-fetched and it is combined with the following data in a normal way before being passed to the inter-symbol processing unit 24.

At the same time, different address counters ($\text{addr}_0$, $\text{addr}_1$, $\text{addr}_2$, $\text{addr}_3$, $\text{addr}_4$, $\text{addr}_5$) are used to facilitate the generation of the read addresses. Basically, each address counter is responsible for one OFDM symbol, which is located in one continuous section in the respective memory 16, 18, and each address counter is incremented by a certain value each clock cycle during normal operation. Once the address counter reaches the boundary value of that memory section (i.e. the section of the memory 16, 18 in which that OFDM symbol is stored), the address value will be wrapped around within the memory section. The read address generation is preferably controlled by a dual loop counter, which uses an inner loop and an outer loop. When the inner loop count, inner_cnt, reaches a certain threshold, it is reset to zero and the outer loop count, outer_cnt, is incremented by 1.

The operation of the address generator 20 will now be described in detail with reference to FIG. 10. In step 101, an initialization is performed. Parameters inner_cnt and outer_cnt are set to zero. The six address counters, addr0, addr1, addr2, addr3, addr4, addr5, are initialized to zero. Initial address values init_addr0, init_addr1, init_addr2, init_addr3, init_addr4 and init_addr5 which represent the first address in the continuous section of the memory 16, 18 in which the data bits for the respective OFDM symbol are stored are determined. A parameter, pref_en, is set for each OFDM symbol, which indicates whether pre-fetching is enabled for that symbol. The parameter, pref_en, is initially set to disabled.

In step 103, the first three of the address counters, addr0, addr1 and addr2, are set to the initial address values init_addr0, init_addr1 and init_addr2 respectively. If deintv_type=3, then the fourth, fifth and sixth address counters, addr3, addr4, addr5, are set to the initial address values init_addr3, init_addr4 and init_addr5 respectively.

In step 105, a pair of data bits in one memory location are pre-fetched for each OFDM symbol whose pref_en is high. These data bits are obtained from the address indicated by the appropriate init_addr.

In step 107, one memory location for symbols 0 and 1 are read in accordance with the values of addr0 and addr1 respectively.

In step 109, the value of addr0 is incremented by 20, and the value of addr1 is incremented by 20 if the current value of addr1 is less than 180. Otherwise, the value of addr1 is decremented by 80.

In step 111, it is determined whether deintv_type=3. If deintv_type=1 or 2, then the process moves to step 113 in which a memory location for symbol 2 is read in accordance with the value of addr2. In step 115, which follows step 113, the value of addr2 is incremented by 20 if the current value of addr2 is less than 280, otherwise, the value of addr2 is decremented by 80. The process then moves to step 117.

If, in step 111, it is determined that deintv_type=3, then the process moves to step 119 in which one memory location for symbols 2, 3, 4 and 5 are read in accordance with the values of addr2, addr3, addr4 and addr5 respectively. In step 121, which follows step 119, the value of addr2 is incremented by 20 if the current value of addr2 is less than 280, otherwise, the value of addr2 is decremented by 80. The value of addr3 is incremented by 20 if the current value of addr3 is less than 380, otherwise, the value of addr3 is decremented by 80. The value of addr4 is incremented by 20 if the current value of addr4 is less than 480, otherwise, the value of addr4 is decremented by 80. The value of addr5 is incremented by 20 if the current value of addr5 is less than 580, otherwise, the value of addr5 is decremented by 80. The process then moves to step 117.

In step 117, it is determined whether the value of inner_cnt is 4. If the value of inner_cnt is not 4, the process moves to step 123 in which the inner_cnt is incremented. After the inner_cnt is incremented, the process returns to step 107 and a memory location is read for symbols 0 and 1 in accordance with the current values for addr0 and addr1.

If the value of inner_cnt is not 4, the process moves to step 125 in which it is determined whether the outer_cnt is 19. If the value of the outer_cnt is 19, the process is complete for those six OFDM symbols, and the process returns to the initialization step 101, where to process repeats for subsequent symbols. If the value of the outer_cnt is not 19, the process moves to step 127.

In step 127, if deintv_type=1, the value of the outer_cnt is incremented by 1, and the values of init_addr0, init_addr1 and init_addr2 are incremented by 1.

If deintv_type=2, then the value of outer_cnt is incremented by 2, and the values of init_addr0, init_addr1 and init_addr2 are incremented by 2.

If deintv_type=3, then the value of the outer_cnt is incremented by 1, and the values of init_addr0, init_addr1, init_addr2, init_addr3, init_addr4 and init_addr5 are incremented by 1.

In all three situations, the inner_cnt is set to zero.

Figures 11, 12:
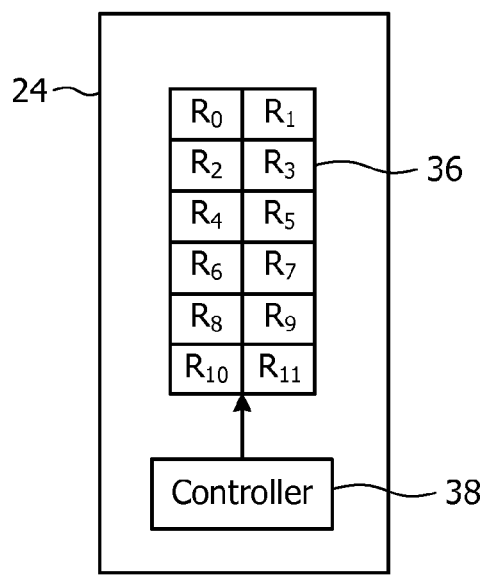
FIG. 11 is a table illustrating the values of pref_en for various combinations of deintv_type, outer_cnt and symbol index in accordance with the invention.
FIG. 12 is a block diagram of an inter-symbol post-processing unit in accordance with the invention.

The process then passes to step 129 in which the value of pref_en is updated based on the current value of the outer_cnt for each OFDM symbol. The table in FIG. 11 illustrates the values of pref_en for the various possible combinations of deintv_type, outer_cnt and the index of the current symbol.

After the pref_en value has been updated, the process returns to step 103, where the address counters are set to the value of the respective init_addr.

As mentioned above, the data bits output from the selected memory 16, 18 via the multiplexer 22, pass into an intersymbol post-processing unit 24. FIG. 12 is a block diagram of the post-processing unit 24 in accordance with the invention. The inter-symbol post-processing unit 24 performs symbol deinterleaving to reverse the operation of the symbol interleaving unit 4 shown in FIG. 1. The post-processing unit 24 comprises a register array 36 having twelve locations, respectively numbered $R_0$, $R_1$, ..., $R_{11}$, and a controller 38 for controlling the operation of the register array 36.

As mentioned, two data bits are stored at each memory address in the memories 16, 18, so two data bits are output from one of the memories 16, 18 to the post processing unit 24 each clock cycle. Due to the operation of the preprocessing unit 12, these data bits are consecutive data bits from the same symbol. However, only one soft data bit is stored in each register location of register array 36.

The post-processing unit 24 reorders these pairs of data bits so that the output of the post-processing block matches the expected deinterleaved pattern (i.e. 6/TSF symbols output their deinterleaved bits in a round robin way), which will be the pattern of data bits that were provided to the interleaver 2 in the transmitter.

FIGS. 13(a)-(d) illustrate the operation of the post-processing unit 24 in accordance with the invention. The shaded register locations indicate that valid data is stored there. The un-shaded register locations are available for receiving data. As shown in FIG. 13(a), data bits are written to register locations $R_0$, $R_1$, $R_2$ and $R_3$.

Then, as shown in FIG. 13(b), the data bits in register locations $R_0$ and $R_2$ are read out, along with any data bits stored in register locations $R_4$ and $R_6$. New data bits are written to register locations $R_4$, $R_5$, $R_6$ and $R_7$. It will be appreciated that the operation to read the bits stored in register locations $R_4$ and $R_6$ occurs before the operation to write new bits to those locations. In practice, these operations will occur during the same processor clock cycle.

Then, as shown in FIG. 13(c), the data bits in register locations $R_1$ and $R_3$ are read out of the register, along with any data bits stored in register locations $R_8$ and $R_{10}$. New data bits are written to register locations $R_8$, $R_9$, $R_{10}$ and $R_{11}$.

Then, as shown in FIG. 13(d), the data bits in register locations $R_5$, $R_7$, $R_9$ and $R_{11}$ are read out of the register. These register locations are accessed in numerical order, i.e. $R_5$, $R_7$, $R_9$ and then $R_{11}$. New data bits are written to register locations $R_0$, $R_1$, $R_2$ and $R_3$. The process then repeats from FIG. 13(b) onwards.

Thus, as can be seen from the operation of the post-processing unit 24 described above, the pairs of consecutive data bits from the same symbol are separated for output from the deinterleaver 10.

Thus, as the deinterleaver structure according to the invention uses a combination of registers and memories, the deinterleaver is simple and inexpensive to design and implement. If the scheme used to interleave the data stream is modified in any way, or if an alternative interleaving scheme is used, it is easy to adapt the deinterleaver by changing the operation of the address generation part of the register arrays. Changes in the size of symbols can also be easily adapted to by modifying the size of the memories 16, 18 used in the deinterleaver 10.

As mentioned above, although the invention has been described with reference to an ultra-wideband network in accordance with the "MultiBand OFDM Physical Layer Specification" Release 1.0 from the MultiBand OFDM Alliance, the invention is applicable to any other system which uses multi-level interleaving to protect data communications between two devices. For example, the invention is also applicable to wireless, mobile and satellite communication systems, optical and magneto-optical storage systems and hard disk and digital tape storage systems.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A deinterleaver for deinterleaving a stream of data bits representing a plurality of symbols that have been interleaved using a multi-stage interleaving scheme, the deinterleaver comprising:
a pre-processor that orders the stream of data bits into pairs, such that the data bits in each pair are consecutive data bits from a symbol and switches among a plurality of operating modes using a value of a parameter based upon a data rate used to transmit the stream of data bits;
at least one memory for storing the pairs; and
an address generator that determines addresses in the at least one memory.

2. The deinterleaver as claimed in claim 1, further comprising: a controller that determines a data rate of the stream of data bits, and adjusts both the pre-processor and the address generator in accordance with the determined data rate.

3. The deinterleaver of claim 2, wherein the controller determines the value of the parameter based upon the data rate.

4. The deinterleaver as claimed in claim 1, wherein the pre-processor comprises:
at least one register, the at least one register being controlled to store data bits in the stream, and to output said pairs of data bits.

5. The deinterleaver as claimed in claim 1, further comprising:
a post-processor that receives the stored pairs of data bits and reorders the pairs of data bits such that output of the post-processor corresponds to a deinterleaved set of symbols.

6. The deinterleaver as claimed in claim 5, wherein the post-processor comprises a register.

7. The deinterleaver as claimed in claim 6, wherein the register in the post-processor comprises a plurality of register locations, the register storing said pairs of data bits in consecutive register locations and outputting said data bits from the pairs in a non-consecutive order.

8. The deinterleaver as claimed in claim 5, wherein one of the stages of the multi-stage interleaving scheme comprises inter-symbol interleaving, and the post-processor performs inter-symbol deinterleaving on the data bits output from the at least one memory.

9. The deinterleaver as claimed in claim 1, wherein the at least one memory comprises first and second memories, wherein the address generator generates read addresses for pairs of data bits from a first set of symbols stored in the first memory and generates write addresses for pairs of data bits from a second set of symbols to be written into the second memory.

10. The deinterleaver as claimed in claim 9, wherein, when each of the pairs of data bits from the first set of symbols have been read from said first memory and each of the pairs of data bits from the second set of symbols have been written into said second memory, the address generator generates read addresses for the pairs of data bits from the second set of data bits in the second memory and generates write address for pairs of data bits from a third set of symbols to be written into the first memory.

11. The deinterleaver of claim 9, wherein the first memory and the second memory switch responsibilities after a predetermined number of OFDM symbol periods.

12. The deinterleaver of claim 9, wherein the first memory and the second memory are dual port random access memories.

13. The deinterleaver as claimed in claim 1, wherein the address generator comprises an address counter for each symbol in the plurality of symbols for indicating addresses in the at least one memory from which pairs of data bits are to be read.

14. The deinterleaver as claimed in claim 13, wherein one of the stages of the multi-stage interleaving scheme comprises cyclic shifting, and wherein the read and write address generator selectively pre-fetch a pair of data bits for a symbol from the at least one memory for combination with a pair of data bits read from the at least one memory in accordance with the address counter.

15. The deinterleaver as claimed in claim 1, wherein the deinterleaver in an ultra-wideband system.

16. The deinterleaver as claimed in claim 15, wherein the multi-stage interleaving scheme comprises symbol interleaving, intra-symbol tone interleaving, and intra-symbol cyclic shifts.

17. The deinterleaver of claim 1, wherein symbol and bit deinterleaving are carried out simultaneously.

18. The deinterleaver of claim 1, further comprising:
a dual loop counter that controls the address generator.

19. The deinterleaver of claim 1, wherein the pre-processor comprises:
a plurality of register arrays.

20. The deinterleaver of claim 19, wherein the pre-processor uses all of the plurality of register arrays when the data rate exceeds a threshold.

* * * * *